US010811459B2

(12) United States Patent
Takagi et al.

(10) Patent No.: US 10,811,459 B2
(45) Date of Patent: Oct. 20, 2020

(54) BACKSIDE INCIDENCE TYPE SOLID-STATE IMAGE PICKUP DEVICE

(71) Applicant: HAMAMATSU PHOTONICS K.K., Hamamatsu-shi, Shizuoka (JP)

(72) Inventors: Shin-ichiro Takagi, Hamamatsu (JP); Kentaro Maeta, Hamamatsu (JP); Yasuhito Yoneta, Hamamatsu (JP); Hisanori Suzuki, Hamamatsu (JP); Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/505,993

(22) PCT Filed: Aug. 4, 2015

(86) PCT No.: PCT/JP2015/072096
§ 371 (c)(1),
(2) Date: Feb. 23, 2017

(87) PCT Pub. No.: WO2016/039046
PCT Pub. Date: Mar. 17, 2016

(65) Prior Publication Data
US 2017/0301722 A1   Oct. 19, 2017

(30) Foreign Application Priority Data

Sep. 9, 2014 (JP) .................................. 2014-182973

(51) Int. Cl.
*H01L 27/148* (2006.01)
*H04N 5/369* (2011.01)
(Continued)

(52) U.S. Cl.
CPC ........ *H01L 27/14818* (2013.01); *H01L 27/14* (2013.01); *H01L 27/148* (2013.01);
(Continued)

(58) Field of Classification Search
CPC ......... H01L 27/14818; H01L 27/14825; H01L 27/14; H01L 27/14685; H01L 27/148; H04N 5/369; H04N 5/372
See application file for complete search history.

(56) References Cited

U.S. PATENT DOCUMENTS 5,537,146 A * 7/1996 Tohyama .......... H01L 27/14812
257/288
6,388,278 B1 * 5/2002 Suzuki .............. H01L 27/14818
257/222
(Continued)

FOREIGN PATENT DOCUMENTS

CN   103314441   9/2013
EP   2665097     11/2013
(Continued)

OTHER PUBLICATIONS

English-language translation of International Preliminary Report on Patentability (IPRP) dated Mar. 23, 2017 that issued in WO Patent Application No. PCT/JP2015/072096.

*Primary Examiner* — Matthew C Landau
*Assistant Examiner* — Mark Hatzilambrou
(74) *Attorney, Agent, or Firm* — Faegre Drinker Biddle & Reath LLP

(57) ABSTRACT

A back-illuminated solid-state imaging device includes a semiconductor substrate, a shift register, and a light-shielding film. The semiconductor substrate includes a light incident surface on the back side and a light receiving portion generating a charge in accordance with light incidence. The shift register is disposed on the side of a light-detective surface opposite to the light incident surface of the semi-
(Continued)

conductor substrate. The light-shielding film is disposed on the side of the light-detective surface of the semiconductor substrate. The light-shielding film includes an uneven surface opposing the light-detective surface.

9 Claims, 16 Drawing Sheets

(51) Int. Cl.
H01L 27/14 (2006.01)
H04N 5/372 (2011.01)
H01L 27/146 (2006.01)

(52) U.S. Cl.
CPC .. H01L 27/14685 (2013.01); H01L 27/14825 (2013.01); H04N 5/369 (2013.01); H04N 5/372 (2013.01)

(56) References Cited

U.S. PATENT DOCUMENTS

| | | | | |
|---|---|---|---|---|
| 2006/0221219 | A1* | 10/2006 | Yamada | H01L 27/14685 348/294 |
| 2009/0050947 | A1* | 2/2009 | Dungan | H01L 27/14625 257/294 |
| 2009/0194671 | A1* | 8/2009 | Nozaki | H01L 27/14625 250/208.1 |
| 2011/0254115 | A1 | 10/2011 | Shih et al. | |
| 2012/0038016 | A1* | 2/2012 | Suzuki | H01L 27/1462 257/443 |
| 2012/0212687 | A1 | 8/2012 | Uchida et al. | |
| 2012/0256287 | A1* | 10/2012 | Suzuki | H01L 27/1464 257/460 |
| 2013/0249040 | A1 | 9/2013 | Liu et al. | |

FOREIGN PATENT DOCUMENTS

| | | |
|---|---|---|
| JP | H2-119476 | 5/1990 |
| JP | H06-104414 A | 4/1994 |
| JP | 2002-033473 A | 1/2002 |
| JP | 2004-022560 A | 1/2004 |
| JP | 2010-177705 A | 8/2010 |
| JP | 2010-232494 A | 10/2010 |
| JP | 2010-232495 A | 10/2010 |
| JP | 2011-044542 A | 3/2011 |
| JP | 2012-049431 A | 3/2012 |
| JP | 2012-146917 | 8/2012 |
| JP | 2012-151364 A | 8/2012 |
| JP | 2014-003140 A | 1/2014 |

* cited by examiner

Fig.11
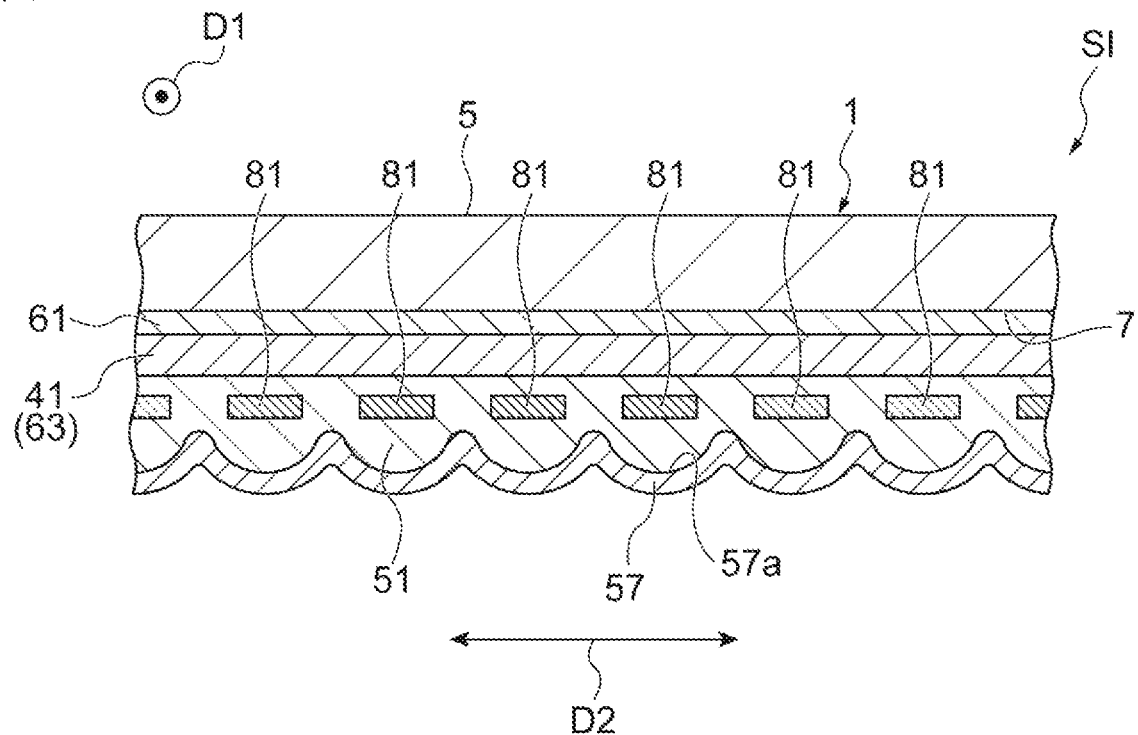
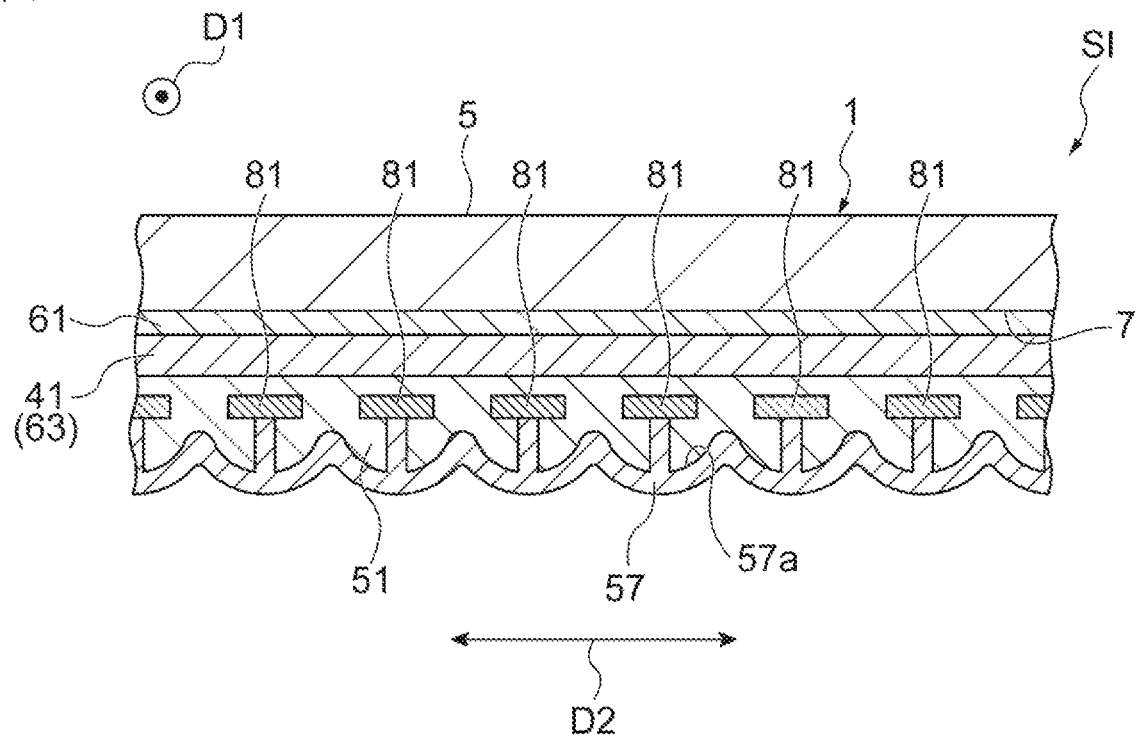

BACKSIDE INCIDENCE TYPE SOLID-STATE IMAGE PICKUP DEVICE

TECHNICAL FIELD

The present invention relates to a back-illuminated solid-state imaging device.

BACKGROUND ART

Known back-illuminated solid-state imaging devices include a semiconductor substrate having a light incident surface on a back side and a light receiving portion generating a charge in accordance with light incidence, a charge transfer unit on a side of a light-detective surface opposite to the light incident surface of the semiconductor substrate, and a light-shielding film on the side of the light-detective surface of the semiconductor substrate (For example, Patent Literature 1). In Patent Literature 1, the light-shielding film prevents re-incidence of light reflected or scattered back from a section other than the back-illuminated solid-state imaging device (a board on which the back-illuminated solid-state imaging device is mounted, for example), from the side of the light-detective surface into the semiconductor substrate.

CITATION LIST

Patent Literature

Patent Literature 1: Japanese Unexamined Patent Publication No. 2002-33473

SUMMARY OF INVENTION

Technical Problem

In the back-illuminated solid-state imaging device (the semiconductor substrate), incident light from a side of the light incident surface may interfere with light that has traveled through the semiconductor substrate and reflected back from the light-shielding film to the side of the light incident surface. The interference of light causes waves in spectral sensitivity characteristics, i.e. an etaloning phenomenon, resulting in an unstable sensitivity.

An object of an aspect of the present invention is to provide a back-illuminated solid-state imaging device capable of suppressing re-incidence of light from a side of a light-detective surface into a semiconductor substrate and suppressing an etaloning phenomenon.

Solution to Problem

One aspect of the present invention is a back-illuminated solid-state imaging device that includes a semiconductor substrate having a light incident surface on a back side and a light receiving portion generating a charge in accordance with light incidence, a charge transfer unit disposed on a side of a light-detective surface opposite to the light incident surface of the semiconductor substrate, and a light-shielding film disposed on the side of the light-detective surface of the semiconductor substrate. The light-shielding film includes an uneven surface opposing the light-detective surface.

In the one aspect, the light-shielding film disposed on the side of the light-detective surface of the semiconductor substrate suppresses re-incidence of light from the side of the light-detective surface into the semiconductor substrate. Since the light-shielding film includes the uneven surface opposing the light-detective surface, light reflected back from the uneven surface has different dispersed phases from those of incident light from the side of the light incident surface into the semiconductor substrate. This causes the offset between the incident light and the reflected light to suppress an etaloning phenomenon.

An insulating film between the semiconductor substrate and the light-shielding film, the light-shielding film being disposed on the insulating film, may further be included, the insulating film may include asperities, and the uneven surface of the light-shielding film may be formed to conform to the asperities of the insulating film. In which case, the light-shielding film with the uneven surface can easily be formed.

A plurality of conductors disposed in the insulating film and along the light-detective surface may further be included, the asperities of the insulating film may be formed in a manner corresponding to the plurality of conductors. In which case, the insulating film with the asperities can easily be formed.

The light-shielding film may be made of a conductive metal material, and among the plurality of conductors, and the light-shielding film may be electrically connected to the conductor other than the conductor to which a predetermined signal is fed. This embodiment does impair a function of an electrode to which the predetermined signal is fed, stabilizing an electric potential of an electrode other than the electrode to which the predetermined signal is fed.

The plurality of conductors may include a plurality of first conductors and a plurality of second conductors, the first conductors and the second conductors being disposed alternately with their ends overlapping each other, and the asperities of the insulating film may be formed in a manner corresponding to the differences in level formed by the first conductors and second conductors. In which case, the insulating film with the asperities can easily be formed.

The light receiving portion may include a plurality of pixels, the insulating film may include a separated portion at least per the plurality of pixels, and the light-shielding film may be disposed between the separated portions of the insulating film. This embodiment suppresses crosstalk of the light between the pixels (the light reflected on the uneven surface).

The light receiving portion may include a plurality of photosensitive areas disposed in a first direction, a plurality of electric potential gradient forming units may be disposed on the side of the light-detective surface of the semiconductor substrate, the plurality of electric potential gradient forming unit forming an electric potential gradient increasing along a second direction perpendicular to the first direction for the corresponding photosensitive area, the charge transfer unit may transfer the charge from the plurality of photosensitive areas in the first direction, and the light-shielding film may be disposed to cover the plurality of electric potential gradient forming units and the charge transfer unit. In which case, the charge generated in the photosensitive area migrates along a potential gradient due to the electric potential gradient formed by the electric potential gradient forming unit. In other words, the charge migrates in the photosensitive area without a group of transfer electrodes to which charge transfer signals with different phases are fed for charge migration. The absence of such a group of transfer electrodes between the light-shielding film and the light-detective surface prominently causes the etaloning phenomenon. Accordingly, the light-shielding film with the uneven surface is also effective in a configuration in which the charge generated in the photosensitive area migrates along the electric potential gradient formed by the electric potential gradient forming unit.

The photosensitive area may have a rectangular shape having the long edges in the second direction in a plane view, and the uneven surface of the light-shielding film may include projected surfaces and depressed surfaces repetitively continued in the second direction. This embodiment surely suppresses the etaloning phenomenon in the longitudinal direction of the photosensitive areas.

Advantageous Effects of Invention

According to the one aspect of the present invention, the back-illuminated solid-state imaging device is provided that is capable suppressing the re-incidence of light from the side of the light-detective surface into the semiconductor substrate and suppressing the etaloning phenomenon.

BRIEF DESCRIPTION OF DRAWINGS

FIG. 11 is a drawing for explaining cross-sectional configurations of back-illuminated solid-state imaging devices according to a modified example of the embodiment.

DESCRIPTION OF EMBODIMENTS

The preferred embodiments of the present invention will be described below in detail with reference to the accompanying drawings. In the description, the same elements or elements with the same function will be denoted by the same reference signs, omitting overlapping description.

Figure 1:
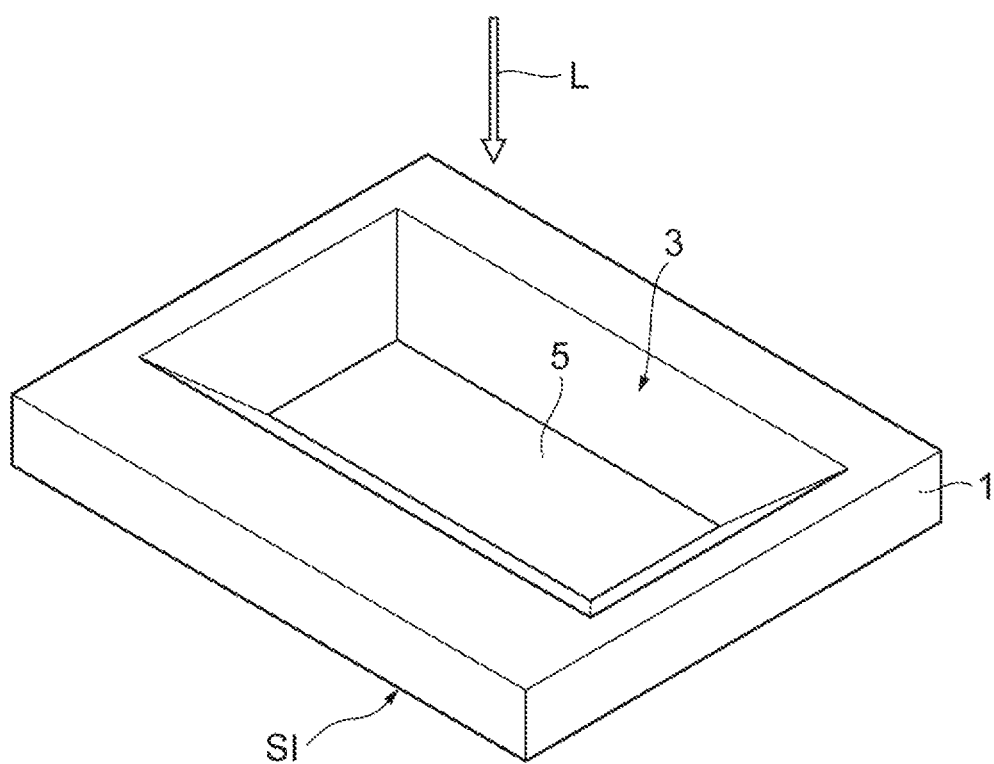
FIG. 1 is a perspective view of a back-illuminated solid-state imaging device according to an embodiment.
Figure 2:
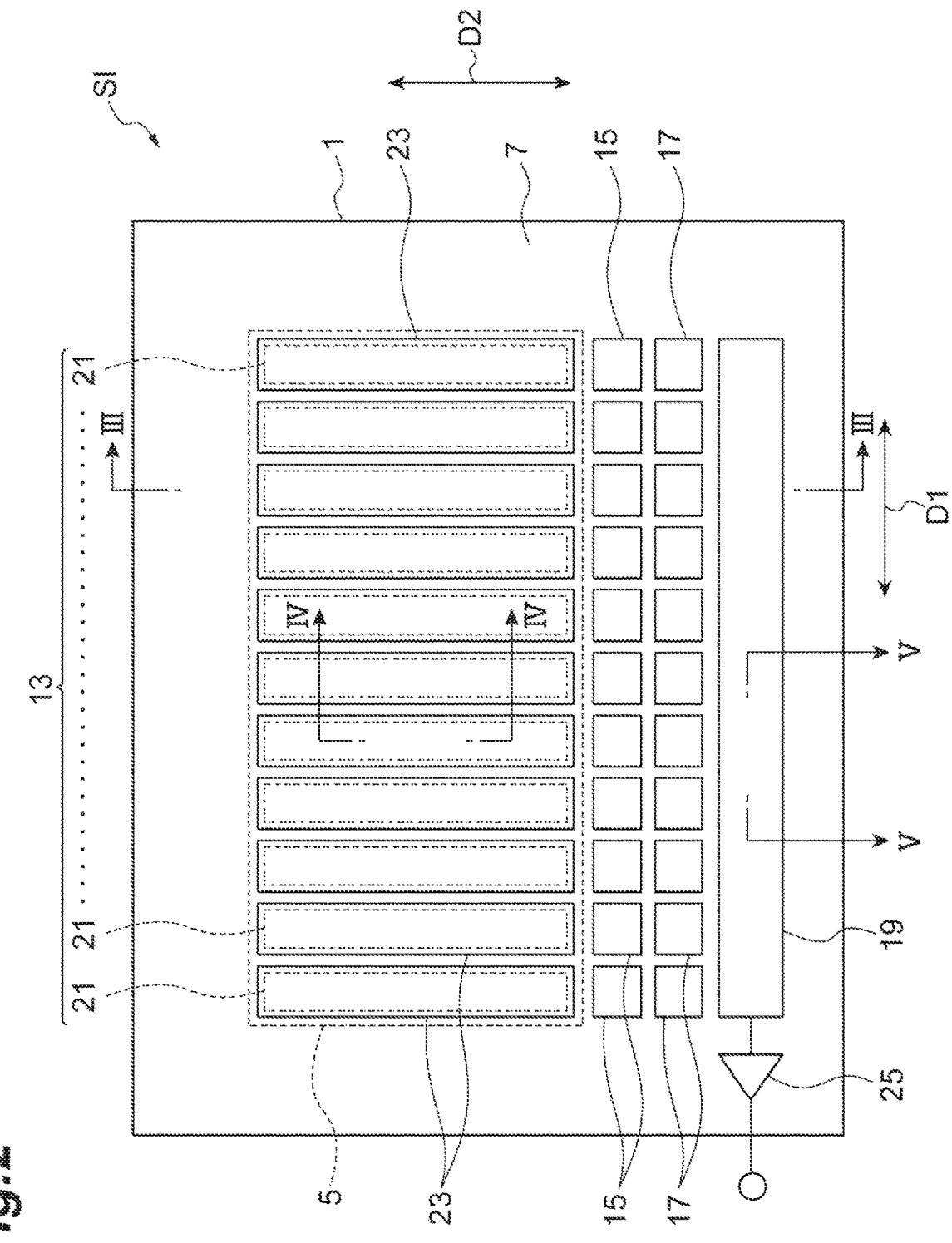
FIG. 2 is a schematic view for explaining a configuration of back-illuminated solid-state imaging device according to the embodiment.
Figure 3:
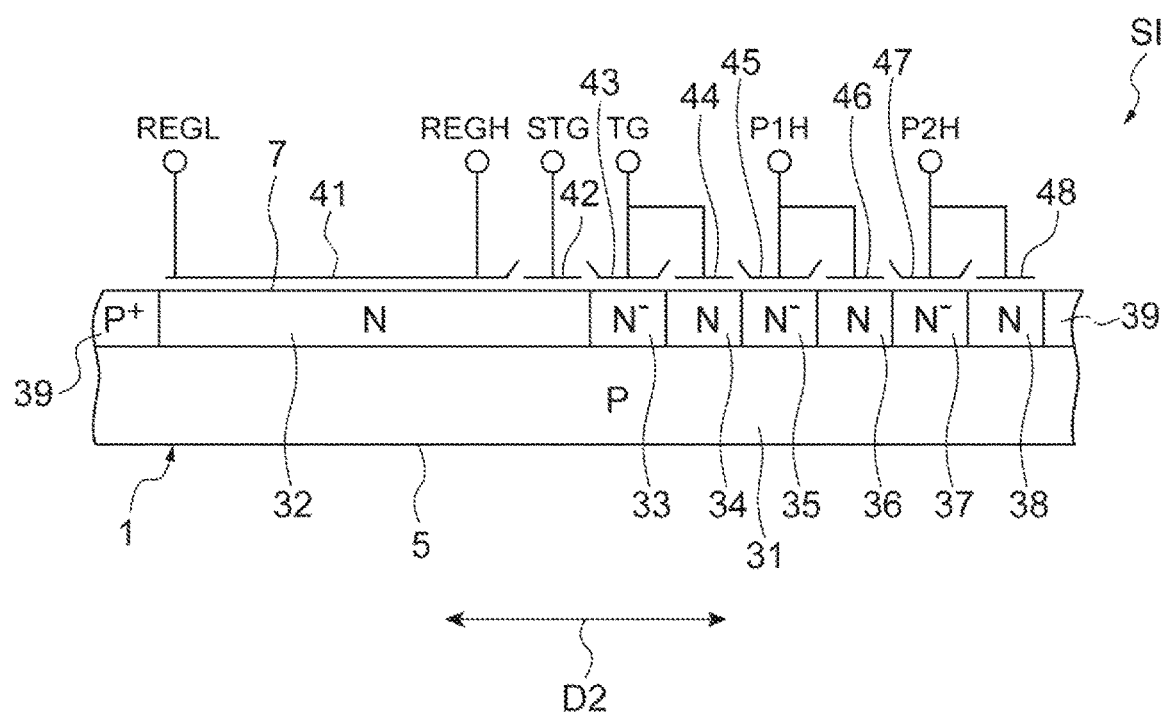
FIG. 3 is a schematic view for explaining a cross-sectional configuration along line of FIG. 2.
Figure 4:
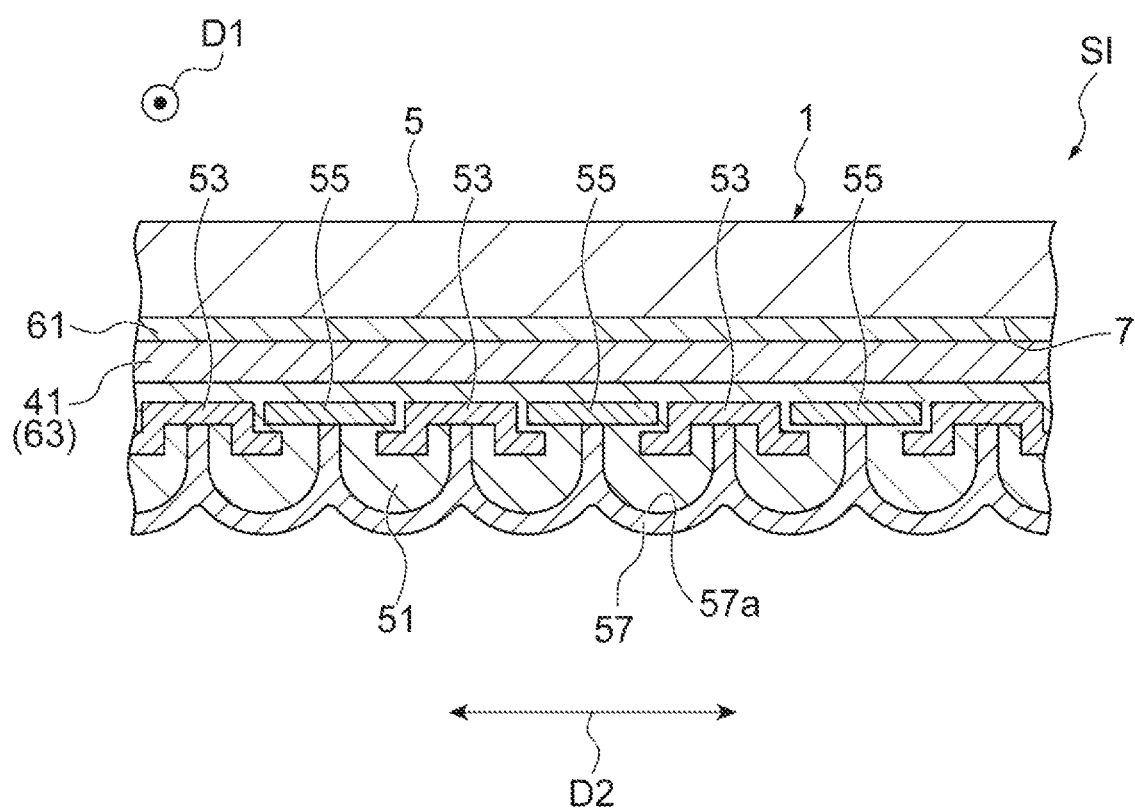
FIG. 4 is a cross-sectional view taken along line IV-IV of FIG. 2.
Figure 5:
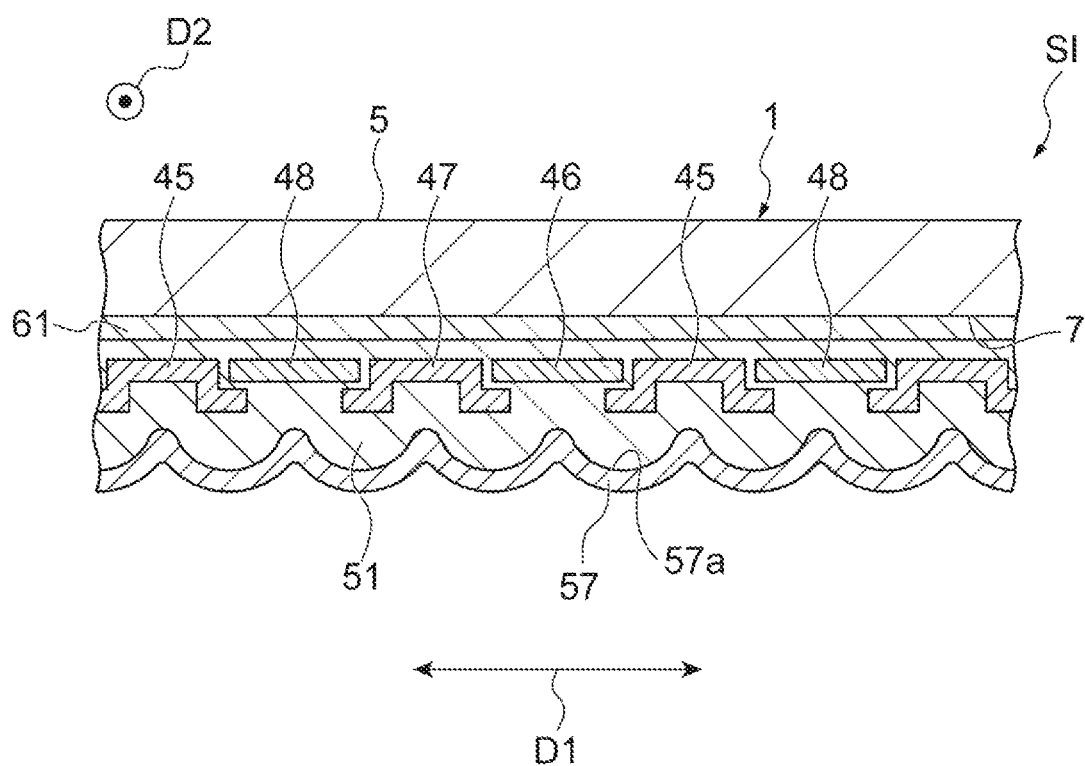
FIG. 5 is a cross-sectional view taken along line V-V of FIG. 2.

With reference to FIGS. 1 to 5, a configuration of a back-illuminated solid-state imaging device SI of the present embodiment will now be described. FIG. 1 is a perspective view of the back-illuminated solid-state imaging device of the present embodiment. FIG. 2 is a schematic view for explaining a configuration the back-illuminated solid-state imaging device of the present embodiment. FIG. 3 is a schematic view for explaining a cross-sectional configuration along line of FIG. 2. FIG. 4 is a cross-sectional view taken along line IV-IV of FIG. 2. FIG. 5 is a cross-sectional view taken along line V-V of FIG. 2.

As shown in FIG. 1, the back-illuminated solid-state imaging device SI is a back-thinned (BT)-CCD linear image sensor including a back-thinned semiconductor substrate 1. The semiconductor substrate 1 is thinned by etching with a KOH solution, for example. The semiconductor substrate 1 includes a recess 3 in the central area and a thick frame around the recess 3. Sidewalls of the recess 3 are inclined to form an obtuse angle with a bottom surface 5.

The thinned central area of the semiconductor substrate 1 constitutes an imaging area (a light receiving portion), and light L is incident onto the imaging area. A bottom surface 5 of the recess 3 in the semiconductor substrate 1 is a light incident surface. A back side of the semiconductor substrate 1, i.e. a side opposite to the light incident surface is a light-detective surface 7 (See FIGS. 2, 4, and 5). The frame may be removed by etching. In which case, the back-illuminated solid-state imaging device SI is of an entirely thinned type.

As shown in FIG. 2, the back-illuminated solid-state imaging device SI includes a light receiving portion 13, a plurality of storage units 15, a plurality of transfer units 17, and a shift register 19 as a charge transfer unit on a side of the light-detective surface 7.

The light receiving portion 13 includes a plurality of photosensitive areas 21 and a plurality of electric potential gradient forming units 23. The photosensitive areas 21 are sensitive to light incidence, and generate a charge in accordance with intensity of the incident light. The photosensitive area 21 has a rectangular shape having two long edges and two short edges in a plane view. The photosensitive areas 21 are disposed in a first direction D1. In the present embodiment, the first direction D1 is in the direction of the short edges of the photosensitive areas 21. The photosensitive areas 21 are disposed in an array in a one-dimensional direction, which is in the first direction D1. One photosensitive area 21 constitutes one pixel in the light receiving portion 13.

Each of the electric potential gradient forming units 23 is disposed in a manner corresponding to each of the photosensitive areas 21. The electric potential gradient forming unit 23 forms, for the corresponding the photosensitive area 21, an electric potential gradient increasing along a second direction D2 perpendicular to the first direction D1. In the present embodiment, the second direction D2 is perpendicular to the first direction D1 and in the direction of the long edges of the photosensitive areas 21. The charge generated in the photosensitive area 21 is discharged from a second short edge of the photosensitive area 21 by the electric potential gradient forming unit 23. In other words, the electric potential gradient forming unit 23 forms the electric potential gradient that is made higher on the other short edge side of the photosensitive area 21 than that on the one short edge side of the photosensitive area 21.

Each of the storage units 15 is disposed in a manner corresponding to each of the photosensitive areas 21 on a side of the other short edge of the photosensitive area 21. In other words, the storage units 15 are disposed to be aligned with the photosensitive areas 21 in the second direction D2 on the side of the other short edges of the photosensitive areas 21. The storage unit 15 is located between the photosensitive area 21 and the transfer unit 17. In the present embodiment, the charge discharged from the photosensitive area 21 by the electric potential gradient forming unit 23 is accumulated in the storage units 15. The charge accumulated in the storage unit 15 is transferred to the corresponding transfer unit 17.

Each of the transfer units 17 is disposed in a manner corresponding to each of the storage units 15 between the corresponding storage unit 15 and shift register 19. In other words, the transfer units 17 are disposed to be aligned with the storage units 15 in the second direction D2 on the side of the other short edges of the photosensitive areas 21. The transfer units 17 are disposed between the storage units 15 and the shift register 19. The transfer unit 17 obtains the charge accumulated in the storage unit 15, and transfers the obtained charge to the shift register 19.

The shift register 19 is disposed in such a manner that each of the transfer units 17 is disposed between the corresponding storage unit 15 and the shift register 19. In other words, the shift register 19 is disposed on the side of the other short edges of the photosensitive areas 21. The shift register 19 obtains the charges transferred from each transfer unit 17. The shift register 19 transfers the obtained charges in the first direction D1, and sequentially outputs the charges to an output unit 25. The charge output from the shift register 19 is converted to a voltage by the output unit 25, and output to the outside of the back-illuminated solid-state imaging device SI as the voltage of each photosensitive area 21. The output unit 25 includes a floating diffusion amplifier (FDA), for example.

Isolation areas are disposed between adjacent photosensitive areas 21, between adjacent storage units 15, and between adjacent transfer units 17. The isolation areas enable electric isolation between the photosensitive areas 21, between the storage units 15, and between the transfer units 17.

As shown in FIG. 3, the light receiving portion 13, the storage units 15, the transfer units 17, and the shift register 19 are formed in the semiconductor substrate 1. The semiconductor substrate 1 includes a p-type semiconductor layer 31 to be a base of the semiconductor substrate 1, n-type semiconductor layers 32, 34, 36, 38, n$^-$-type semiconductor layers 33, 35, 37, and a p$^+$-type semiconductor layer 39 that are formed on one side of the p-type semiconductor layer 31 (on the side of the light-detective surface 7 of the semiconductor substrate 1). In the present embodiment, the semiconductor substrate 1 is a silicon substrate. "+" marked behind the conductivity type indicates a high impurity concentration. The high impurity concentration means an impurity concentration of $1 \times 10^{17}$ cm$^{-3}$ or higher, for example. "−" marked behind the conductivity type indicates a low impurity concentration. The low impurity concentration means an impurity concentration of $1 \times 10^{15}$ cm$^{-3}$ or lower, for example. Examples of n-type impurities include N, P, As, or the like. Examples of p-type impurities include B, Al, or the like.

The p-type semiconductor layer 31 and the n-type semiconductor layer 32 form a pn junction. The n-type semiconductor layer 32 constitutes the photosensitive areas 21 that generate a charge in accordance with light incidence. The n-type semiconductor layer 32 has a rectangular shape having two long edges and two short edges in a plane view. The n-type semiconductor layers 32 are aligned in the first direction D1, and located like an array form in one-dimensional direction. In other words, the respective n-type semiconductor layers 32 are aligned in a direction along a short edge direction of the n-type semiconductor layer 32. The n-type semiconductor layers 32 are disposed in the thinned central area of the semiconductor substrate 1. The above-described isolation area can be made of a p$^+$-type semiconductor layer.

An electrode 41 is disposed for the n-type semiconductor layer 32. The electrode 41 is formed on an insulation layer (not illustrated in FIG. 3) disposed on the n-type semiconductor layer 32. The electrode 41 constitutes the electric potential gradient forming unit 23. The electrode 41 constitutes a so-called resistive gate electrode and is formed in a manner extending in the second direction D2.

Due to an electric potential difference between both ends (REGL and REGH) of the electrode 41 in the second direction D2, the electrode 41 forms the electric potential gradient in accordance with electric resistance components in the second direction D2 of the electrode 41. In other words, the electrode 41 forms an increasing electric potential gradient, which is higher at the other short edge than at the one short edge of the photosensitive area 21, in the second direction D2. A potential gradient is formed by the electric potential gradient in a region immediately below the electrode 41 in the n-type semiconductor layer 32.

The charge generated in accordance with light incidence in the n-type semiconductor layer 32 migrates in the second direction D2 along the potential gradient in the region immediately below the electrode 41.

An electrode 42 is disposed for the n-type semiconductor layer 32. The electrode 42 is disposed adjacent to the electrode 41 in the second direction D2. The electrode 42 is formed on an insulation layer (not illustrated in FIG. 3) disposed on the n-type semiconductor layer 32.

A voltage (STG) higher than the voltages applied to both ends of the electrode 41 is applied to the electrode 42.

Therefore, a potential in a region immediately below the electrode 42 in the n-type semiconductor layer 32 is lower than a potential in the region immediately below the electrode 41 in the n-type semiconductor layer 32. For this reason, the charge migrating along the potential gradient in the region immediately below the electrode 41 flows into a potential well formed in the region immediately below the electrode 42, and is accumulated in the potential well. The electrode 42 and the n-type semiconductor layer 32 constitute the storage unit 15.

A pair of transfer electrodes 43, 44 are disposed adjacent to the electrode 42 in the second direction D2. The transfer electrodes 43, 44 are respectively formed on the n$^-$-type semiconductor layer 33 and the n-type semiconductor layer 34 via an insulation layer (not illustrated in FIG. 3). The n$^-$-type semiconductor layer 33 and the n-type semiconductor layer 34 are disposed adjacent to the n-type semiconductor layer 32 in the second direction D2.

A signal TG is supplied to the transfer electrodes 43, 44 from a control circuit (not illustrated). Potential depths in the n$^-$-type semiconductor layer 33 and the n-type semiconductor layer 34 are changed in accordance with the signal TG supplied to the transfer electrodes 43, 44. Consequently, the charge accumulated in the region immediately below the electrode 42 is transferred to the shift register 7. The transfer electrodes 43, 44, the n$^-$-type semiconductor layer 33 under the transfer electrode 43, and the n-type semiconductor layer 34 under the electrode 44 constitute the transfer unit 17.

A pair of transfer electrodes 45, 46 and another pair of transfer electrodes 47, 48 are disposed adjacent to the transfer electrode 44 in the second direction D2. The transfer electrodes 45, 46, 47, 48 are respectively formed on the $n^-$-type semiconductor layers 35, 37 and the n-type semiconductor layer 36, 38 via an insulation layer (not illustrated in FIG. 3). The $n^-$-type semiconductor layers 35, 37 and the n-type semiconductor layers 36, 38 are disposed adjacent to the n-type semiconductor layer 34 in the second direction D2.

A signal P1H is supplied to the transfer electrodes 45, 46 from the control circuit (not illustrated) and a signal P2H is supplied to the transfer electrodes 47, 48 from the control circuit (not illustrated). The signal P1H is in the phase opposite to that of the signal P2H. The potential depths in the $n^-$-type semiconductor layers 35, 37 and the n-type semiconductor layers 36, 38 are changed in accordance with the signal P1H supplied to the transfer electrodes 45, 46 and the signal P2H supplied to the transfer electrodes 47, 48. Consequently, the charge obtained from the transfer unit 17 is transferred to the output unit 25. The transfer electrodes 45, 46, 47, 48, the $n^-$-type semiconductor layers 35, 37 respectively under the transfer electrodes 45, 47, and the n-type semiconductor layers 36, 38 respectively under the transfer electrodes 46, 48 constitute the shift register 19.

The $p^+$-type semiconductor layer 39 electrically separates the n-type semiconductor layers 32, 34, 36, 38 and the $n^-$-type semiconductor layers 33, 35, 37 from the other region in the semiconductor substrate 1. The electrodes 41, 42 and the transfer electrodes 43, 44, 45, 46, 47, 48 are made of an optically transparent material such as a polysilicon film. The insulation layer described above is a silicon oxide film, for example. Aside from the n-type semiconductor layer 32, the n-type semiconductor layers 32, 34, 36, 38 and $n^-$-type semiconductor layers 33, 35, 37 (the storage units 15, the transfer units 17, and the shift register 19), and the $p^+$-type semiconductor layer 39 are disposed in the frame of the semiconductor substrate 1.

As shown in FIGS. 4 and 5, the back-illuminated solid-state imaging device SI includes an insulating film 51, a plurality of first conductors 53, a plurality of second conductors 55, and a light-shielding film 57. The insulating film 51, the first conductors 53, the second conductors 55, and the light-shielding film 57 are disposed on the side of the light-detective surface 7 of the semiconductor substrate 1. The insulating film 51 is disposed on the electrodes 41 42 and the transfer electrodes 43, 44, 45, 46, 47, 48 to cover these electrodes 41 to 48. The insulating film 51 is formed to cover an entire area of the light-detective surface 7 when viewed from the side of the light-detective surface 7 of the semiconductor substrate 1. The insulating film 51 is made of an optically transparent material such as a Boron Phosphor Silicate Glass (BPSG).

The first conductors 53 and second conductors 55 are disposed in the insulating film 51 and are aligned along the light-detective surface 7. The first conductors 53 and second conductors 55 are disposed on the electrode 41 (the n-type semiconductor layer 32), i.e. on the light receiving portion 13 (the photosensitive areas 21). The first conductors 53 and second conductors 55 extend along the first direction D1 between ends of the light receiving portion 13 in the first direction D1. The first conductors 53 and second conductors 55 are made of an optically transparent material such as a polysilicon film.

The first conductors 53 and the second conductors 55 are disposed alternately with their ends overlapping each other in the second direction D2. The overlapping area of the first conductors 53 and second conductors 55 has a greater thickness by the thickness of the first conductor 53 or the second conductor 55 than the area consisting only of the first conductor 53 or the second conductor 55. The overlapping areas of the first conductors 53 and second conductors 55 form projections and the areas consisting only of the first conductors 53 or the second conductors 55 form depressions. In other words, the overlapping area of the first conductors 53 and second conductors 55 and the area consisting only of the first conductor 53 or the second conductor 55 form a difference in level in the second direction D2.

The light-shielding film 57 is disposed on the insulating film 51 to cover the entire area of the insulating film 51. In other words, the light-shielding film 57 is also formed to cover the entire area of the light-detective surface 7 when viewed from the side of the light-detective surface 7 of the semiconductor substrate 1. The insulating film 51 is disposed between the semiconductor substrate 1 and the light-shielding film 57. The light-shielding film 57 suppresses re-incidence of light reflected or scattered back from a section other than the back-illuminated solid-state imaging device SI (a board on which the back-illuminated solid-state imaging device SI is mounted, for example), from the side of the light-detective surface 7 into the semiconductor substrate 1. The light-shielding film 57 is made of a conductive metal material (such as Al or AlSiTi), for example. In a case where the light-shielding film 57 is made of a conductive metal material, the light-shielding film 57 functions as a reflective film.

The insulating film 51 includes asperities. The asperities of the insulating film 51 are formed in a manner corresponding to the differences in level formed by the first conductors 53 and second conductors 55. The insulating film 51 includes a projection corresponding to the overlapping area of the first conductors 53 and second conductors 55, and a depression corresponding to the area consisting only of the first conductor 53 or the second conductor 55. The asperities of the insulating film 51 are repetitively continued in the second direction D2.

The transfer electrodes 45, 46, 47, 48 are disposed alternately with their ends overlapping each other in the first direction D1. This arrangement of the transfer electrodes 45, 46, 47, 48 forms differences in level in the first direction D1. Therefore, the insulating film. 51 also includes the asperities corresponding to the differences in level formed by the transfer electrodes 45, 46, 47, 48.

The light-shielding film 57 includes an uneven surface 57a opposing the light-detective surface 7. The uneven surface 57a conforms to the asperities of the insulating film 51. Therefore, the uneven surface 57a includes projected surfaces and depressed surfaces repetitively continued in the second direction. A cross section of the uneven surface 57a parallel to a thickness direction of the semiconductor substrate 1 (the insulating film 51) forms a corrugated shape in which concave curves and convex curves are alternately continuous. In the present embodiment, the cross section of the uneven surface 57a parallel to the second direction D2 and parallel to the above thickness direction forms a corrugated shape. Therefore, the projected surfaces and depressed surfaces of the uneven surface 57a extend in the first direction D1. The uneven surface 57a has the same pattern of the projected surfaces and depressed surfaces in each photosensitive area 21. The same pattern does not mean mathematically the same pattern but substantially the same pattern. When the difference in dimension or height (depth) between the patterns is within ±10%, these patterns are considered to be the same.

A distance from the light-detective surface 7 to the uneven surface 57a in a direction perpendicular to the light-detective surface 7 continuously and periodically varies along the second direction D2. That is, a length of an optical path from the light incident surface (the bottom surface 5) of the semiconductor substrate 1 to the uneven surface 57a in the thickness direction of the semiconductor substrate 1 (the direction in which the light incident surface and the light-detective surface 7 in the semiconductor substrate 1 oppose each other) takes a different value at a different in a manner corresponding to the uneven surface 57a (the asperities of the insulating film 51).

Contact holes are formed in the insulating film 51 at predetermined positions corresponding to the first conductors 53 and second conductors 55. The light-shielding film 57 is electrically and physically connected to the first conductors 53 and second conductors 55 with the contact holes formed in the insulating film 51. The light-shielding film 57 is not connected to the transfer electrodes 45, 46, 47, 48 to which the signals P1H and P2H are fed for charge transfer. In other words, the light-shielding film 57 is electrically connected to the conductors (the first conductors 53 and second conductors 55) other than the conductors to which the predetermined signals are fed (the transfer electrodes 45, 46, 47, 48, for example).

Figure 6:
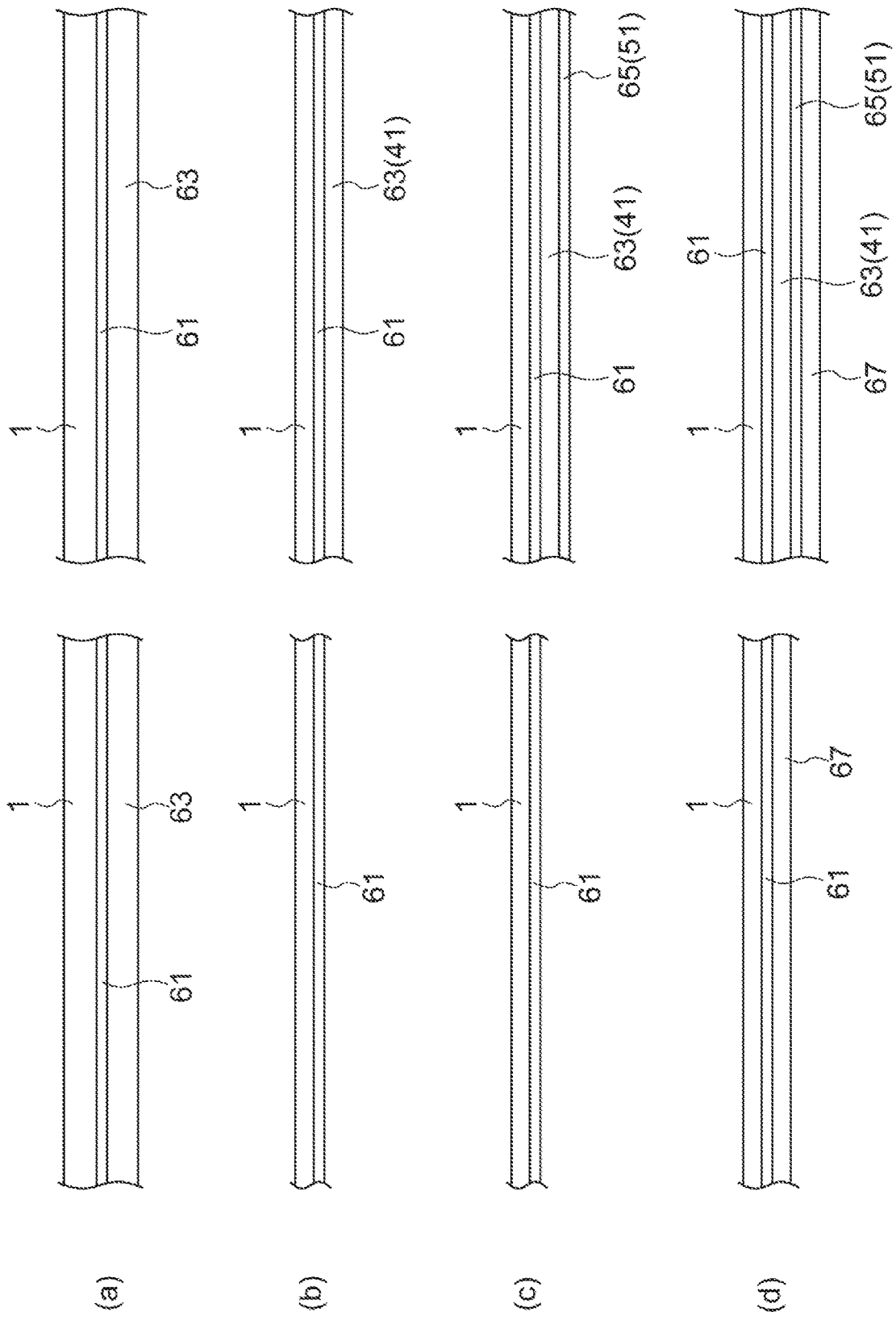
FIG. 6 is a drawing illustrating processes for manufacturing the back-illuminated solid-state imaging device according to the embodiment.
Figure 7:
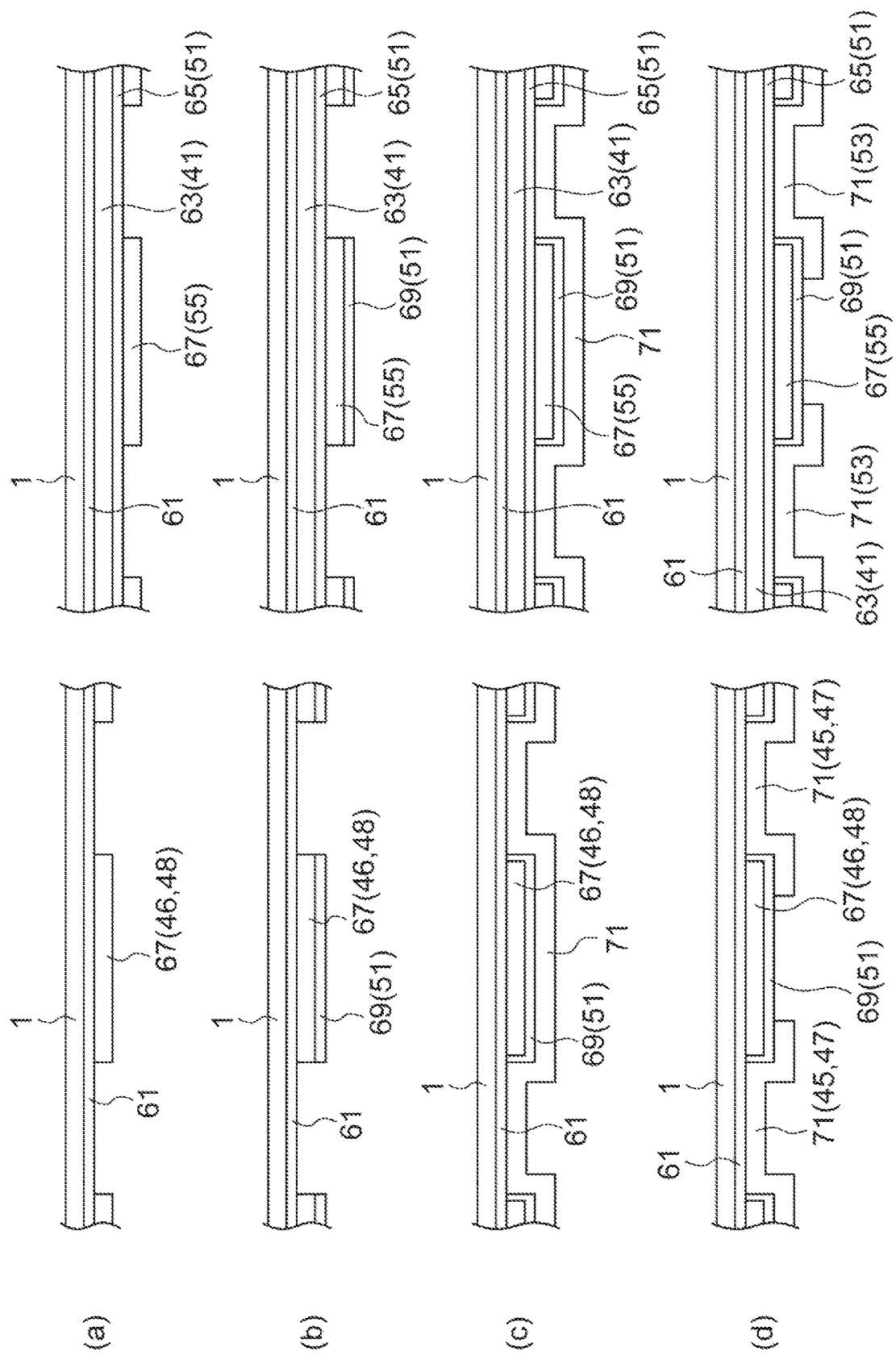
FIG. 7 is a drawing illustrating the processes for manufacturing the back-illuminated solid-state imaging device according to the embodiment.
Figure 8:
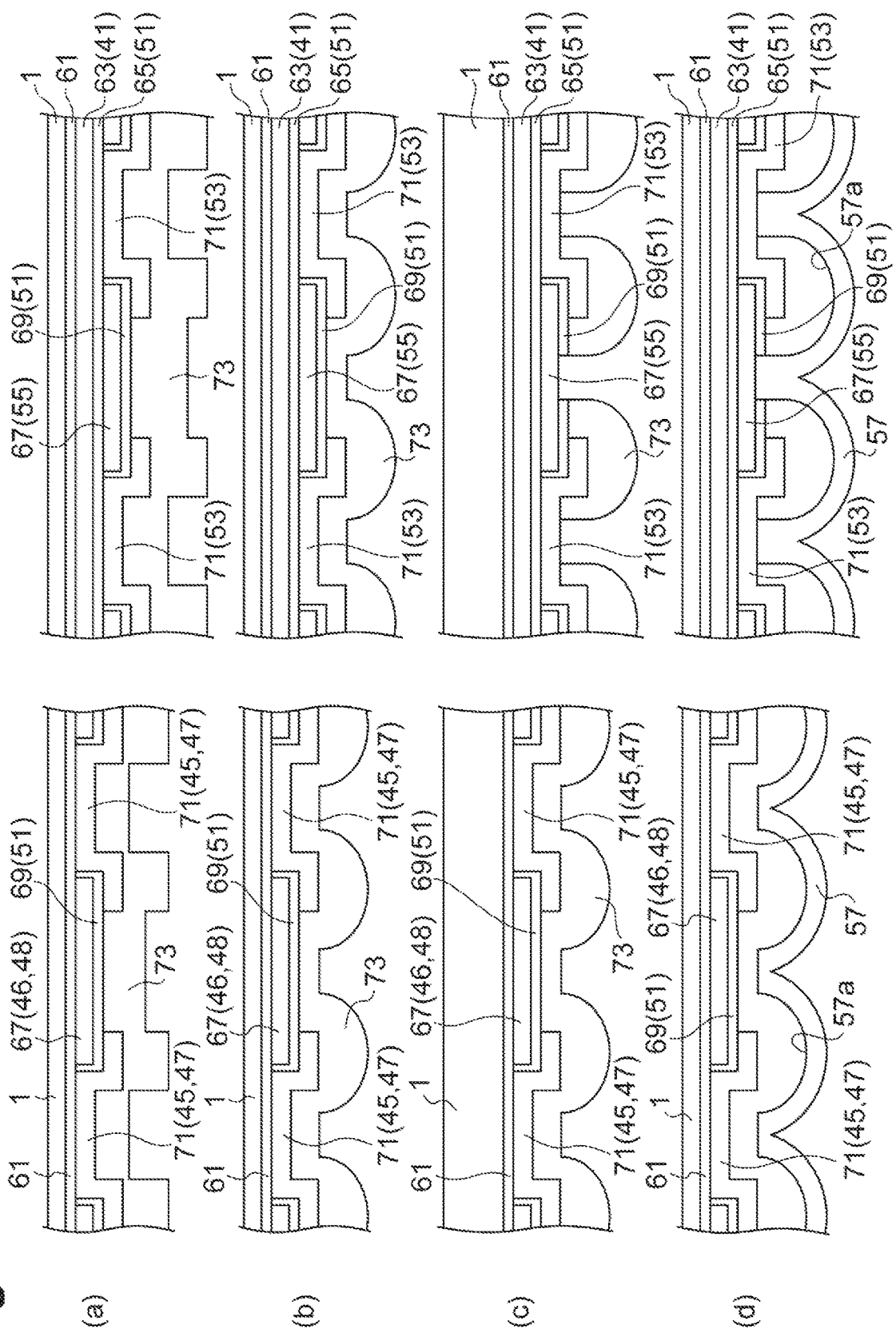
FIG. 8 is a drawing illustrating the processes for manufacturing the back-illuminated solid-state imaging device according to the embodiment.

With reference to FIGS. 6 to 8, processes for manufacturing the back-illuminated solid-state imaging device SI will now be described. FIGS. 6 to 8 are drawings illustrating the processes for manufacturing the back-illuminated solid-state imaging device according to the present embodiment.

First, the semiconductor substrate 1 is prepared. The semiconductor substrate 1 includes the p-type semiconductor layer 31, the n-type semiconductor layers 32, 34, 36, 38, the n⁻-type semiconductor layers 33, 35, 37, and the p⁺-type semiconductor layer 39. Each semiconductor layer is formed by adding the impurities of the corresponding conductivity type to the semiconductor substrate 1. The addition of impurities is performed by ion implantation or the like. Next, a polysilicon film 63 is formed on an oxide film 61 disposed on a side of the light-detective surface 7 of the prepared semiconductor substrate 1 (See (a) in FIG. 6). The oxide film 61 can be formed by thermal oxidation of the surface (the light-detective surface 7) of the semiconductor substrate 1. In which case, the oxide film 61 is a silicon oxide film.

Next, the polysilicon film 63 is partially removed by etching, leaving a portion corresponding to the photosensitive areas 21 (the light receiving portion 13) (See (b) in FIG.). A remaining portion of the polysilicon film 63 constitutes the electrode 41 or the like. Next, an insulating film 65 is formed on the remaining portion of the polysilicon film 63 (See (c) in FIG. 6). The insulating film 65 is made of a BPSG, for example. The insulating film 65 constitutes a part of the insulating film 51 described above. Then, a polysilicon film 67 is formed on a portion of the oxide film 61 without the polysilicon film 63 (the insulating film 65) and on the insulating film 65 (See (d) in FIG. 6).

Next, the polysilicon film 67 is subjected to patterning (See (a) in FIG. 7). The patterning can be performed by etching, for example. The portions of the polysilicon film 67 on the oxide film 61 constitute the transfer electrodes 46, 48. The portions of the polysilicon film 67 on the insulating film 65 constitute the second conductors 55. Then, an insulating film 69 is formed on the patterned polysilicon film 67 (See (b) in FIG. 7). The insulating film 69 is also made of a BPSG, for example, and constitutes a part of the insulating film 51.

Next, a polysilicon film 71 is formed on the insulating film 69 (See (c) in FIG. 7), and the formed polysilicon film 71 is subjected to patterning (See (d) in FIG. 7). The patterning can be performed by etching, for example. The portions of the polysilicon film 71 on the oxide film 61 and the insulating film 69 constitute the transfer electrodes 45, 47. The portions of the polysilicon film 71 on the insulating film 65 and the insulating film 69 constitute the first conductors 53. The patterned polysilicon film 67 and the patterned polysilicon film 71 are disposed alternately with their ends overlapping each other. For this reason, the polysilicon films 67, 71 form differences in level.

Next, an insulating film 73 is formed on the polysilicon film 71 and the insulating film 69 (the polysilicon film 63) (See (a) in FIG. 8). The insulating film 73 is also made of a BPSG, for example, and constitutes a part of the insulating film 51. The insulating film 73 includes asperities corresponding to the differences in level formed by the patterned polysilicon film 63 and polysilicon film 71. Then, the insulating film 73 is subjected to reflow (heat treatment), so that the asperities of the insulating film 73 change their forms (See (b) in FIG. 8). The insulating film 73 is melted, whereby the asperities of the insulating film 73 become smooth.

Next, contact holes are formed at desired positions in the insulating film 73. Consequently, the predetermined polysilicon films 67 and 71 are partially exposed at the contact holes (See (c) in FIG. 8). The contact hole can be formed by etching, for example. Then, the light-shielding film 57 is formed on the insulating film 73 (See (d) in FIG. 8). The light-shielding film 57 can be formed by spattering, for example.

The back-illuminated solid-state imaging device SI is manufactured through these processes.

As described above, in the present embodiment, the light-shielding film 57 is disposed on the side of the light-detective surface 7 of the semiconductor substrate 1 to suppresses re-incidence of light from the outside of the back-illuminated solid-state imaging device SI through the light-detective surface 7 into the semiconductor substrate 1. Since the light-shielding film 57 includes the uneven surface 57a opposing the light-detective surface 7, light reflected back from the uneven surface 57a has different dispersed phases from those of the incident light from the side of the bottom surface 5 (the light incident surface) into the semiconductor substrate 1. This causes the offset between the incident light and the reflected light to suppress an etaloning phenomenon.

The back-illuminated solid-state imaging device SI includes the insulating film 51, on which the light-shielding film 57 is disposed, between the semiconductor substrate 1 and the light-shielding film 57. The insulating film 51 includes asperities. The uneven surface 57a of the light-shielding film 57 conforms to the asperities of the insulating film 51. Consequently, the light-shielding film 57 with the uneven surface 57a can easily be formed.

The back-illuminated solid-state imaging device SI includes the plurality of first conductors 53 and the plurality of second conductors 55 that are disposed in the insulating film 51 and along the light-detective surface 7. The asperities of the insulating film 51 are fainted to correspond to the first and second conductors 53, 55. Consequently, the insulating film 51 with the asperities can easily be formed.

The light-shielding film 57 is made of a conductive metal material, and the first and second conductors 53, 55 are electrically connected to the light-shielding film 57. This configuration stabilizes the electric potentials of the first and second conductors 53, 55. The electrodes to which predetermined signals are fed (the transfer electrodes 45, 46, 47, 48, for example) are not electrically connected to the light-shielding film 57. This configuration does not impair the functions of the electrodes to which the predetermined signals are fed.

The first conductors 53 and the second conductors 55 are disposed alternately with their ends overlapping each other. The asperities of the insulating film 51 are formed to correspond to the differences in level formed by the first and second conductors 53, 55. Consequently, the insulating film 51 with the asperities can easily be formed.

The light receiving portion 13 includes the plurality of photosensitive areas 21 disposed in the first direction D1. The plurality of electric potential gradient forming units 23 are disposed on the side of the light-detective surface 7 of the semiconductor substrate 1. The shift register 19 transfers the charges from the photosensitive areas 21 in the first direction D1. The light-shielding film 57 is disposed to cover the electric potential gradient forming units 23 and the shift register 19. In this configuration, the charges generated in the photosensitive areas 21 migrate along the potential gradients due to the electric potential gradients formed by the electric potential gradient forming units 23. In other words, the charges migrate in the photosensitive areas 21 without a group of transfer electrodes to which charge transfer signals with different phases are fed for charge migration. The absence of such a group of transfer electrodes between the light-shielding film 57 and the light-detective surface 7 prominently causes the etaloning phenomenon. Accordingly, the light-shielding film 57 with the uneven surface 57a is also effective in the configuration in which the charges generated in the photosensitive areas 21 migrate along the electric potential gradients formed by the electric potential gradient forming units 23.

Each of the photosensitive area 21 has a rectangular shape having the long edges in the second direction D2 in a plane view. The uneven surface 57a of the light-shielding film 57 includes the projected surfaces and depressed surfaces repetitively continued in the second direction D2. This configuration surely suppresses an etaloning phenomenon in the longitudinal direction of the photosensitive areas 21 (in the second direction D2).

Advantageous effects of the back-illuminated solid-state imaging device SI in suppressing the etaloning phenomenon will now be described with reference to comparison results of the present embodiment, with Comparative Example 1. The back-illuminated solid-state imaging device SI of the above embodiment was used as Example 1. The back-illuminated solid-state imaging device without the first and second conductors 53, 55 was prepared as Comparative Example 1. In the back-illuminated solid-state imaging device of Comparative Example 1, the insulating film 51 is flat and the light-shielding film 57 includes a flat surface opposing the light-detective surface 7. The back-illuminated solid-state imaging device of Comparative Example 1 has the same structure as that of the back-illuminated solid-state imaging device SI except that the first and second conductors 53, 55 are not provided, the insulating film 51 is flat, and the light-shielding film 57 includes the flat surface opposing the light-detective surface 7.

In the back-illuminated solid-state imaging device SI of Example 1, a distance from the light-detective surface 7 to the highest point in the projected surface of the uneven surface 57a in the direction perpendicular to the light-detective surface 7 is in the range of 100 nm to 10,000 nm, and a distance from the light-detective surface 7 to the deepest point in the depressed surface of the uneven surface 57a in the direction perpendicular to the light-detective surface 7 is in the range of 100 nm to 10,000 nm. The height of the projected surface or the depth of the depressed surface of the uneven surface 57a is thus in the range of 100 nm to 5,000 nm. The interval between the highest points in the projected surfaces of the uneven surface 57a is in the range of 100 nm to 10,000 nm.

Figure 9:
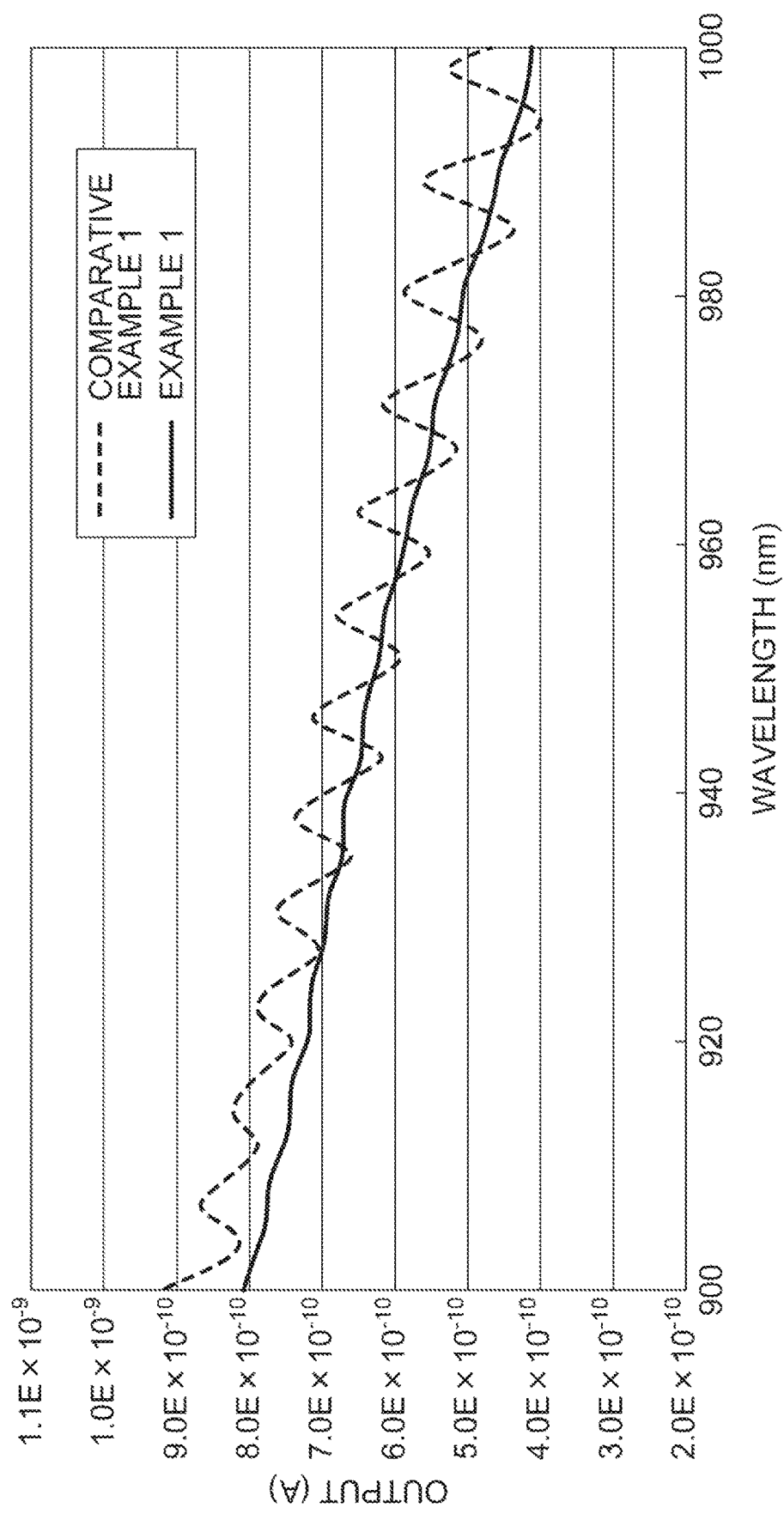
FIG. 9 is a graph illustrating a relationship between a wavelength (nm) and an output (A) in Example 1 and Comparative Example 1.

In Example 1 and Comparative Example 1, the sensitivity characteristics were measured. Specifically, wavelength characteristics of outputs of the back-illuminated solid-state imaging device SI of Example 1 and the back-illuminated solid-state imaging device of Comparative Example 1 were measured. FIG. 9 illustrates the results. FIG. 9 is a graph illustrating a relationship between the wavelength (nm) and the output (A) in Example 1 and Comparative Example 1. As shown in FIG. 9, the etaloning phenomenon is suppressed in Example 1 compared to Comparative Example 1.

Figure 10:
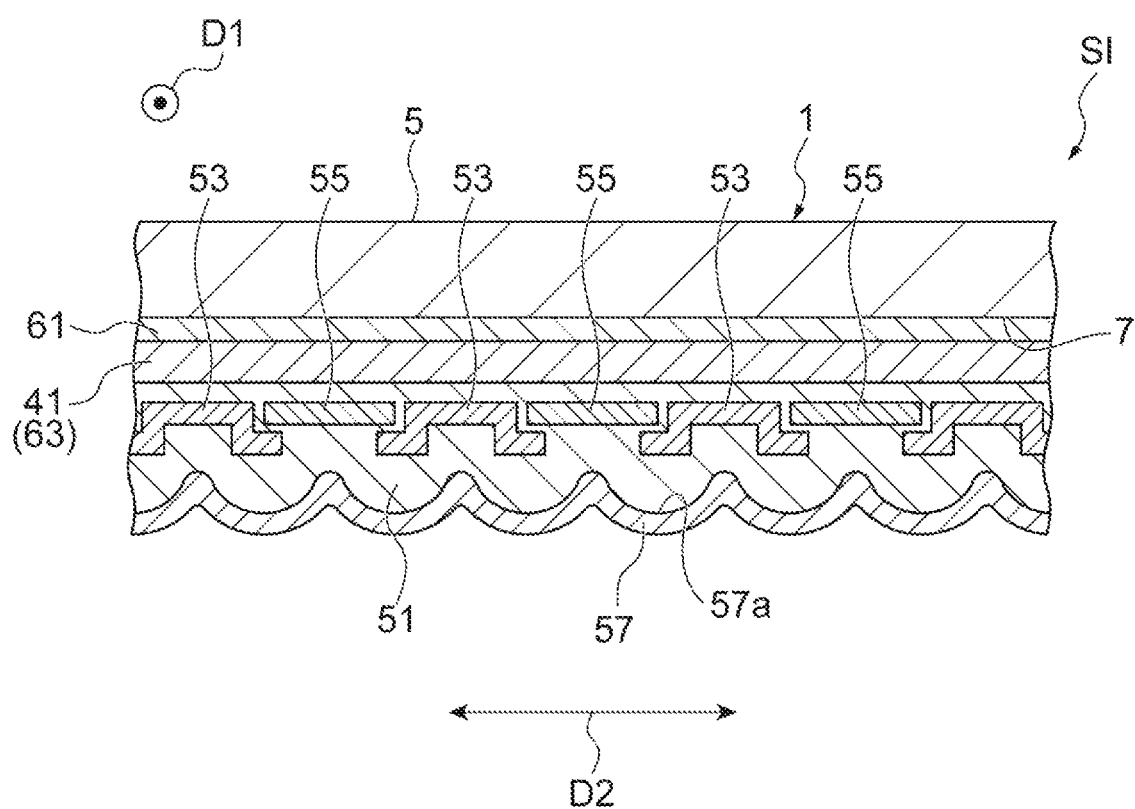
FIG. 10 is a drawing for explaining a cross-sectional configuration of a back-illuminated solid-state imaging device according to a modified example of the embodiment.

Next, with reference to FIG. 10 and FIG. 11, the configuration of back-illuminated solid-state imaging devices SI according to modified examples of the present embodiment will now be described. FIG. 10 and FIG. 11 are drawings for explaining cross-sectional configurations of the back-illuminated solid-state imaging devices according to the modified examples of the present embodiment.

In the modified example of FIG. 10, the first and second conductors 53, 55 are not electrically connected to the light-shielding film 57. In the modified examples of FIG. 11, the back-illuminated solid-state imaging devices SI include a plurality of conductors 81 instead of the first and second conductors 53, 55.

The plurality of conductors 81 are disposed in the insulating film 51 and along the light-detective surface 7 of the semiconductor substrate 1. The plurality of conductors 81 are disposed over the light receiving portion 13 (the photosensitive areas 21) as in the first and second conductors 53, 55. The conductors 81 extend along the first direction D1 between the ends of the light receiving portion 13 in the first direction D1. The conductors 81 are also made of an optically transparent material such as a polysilicon film.

The conductors 81 are disposed separately from each other in the second direction D2. The asperities of the insulating film 51 are formed to correspond to the conductors 81. The insulating film 51 includes a projection corresponding to the area with the conductor 81 and a depression corresponding to the area without the conductor 81. Also in these modified examples, the asperities of the insulating film 51 are repetitively continued in the second direction D2.

In the modified example of (a) in FIG. 11, the conductors 81 are not electrically connected to the light-shielding film 57. In the modified example of (b) in FIG. 11, the conductors 81 are electrically connected to the light-shielding film 57. The electrical connection of the conductors 81 with the light-shielding film 57 stabilizes the electric potential of each conductor 81.

Figure 12:
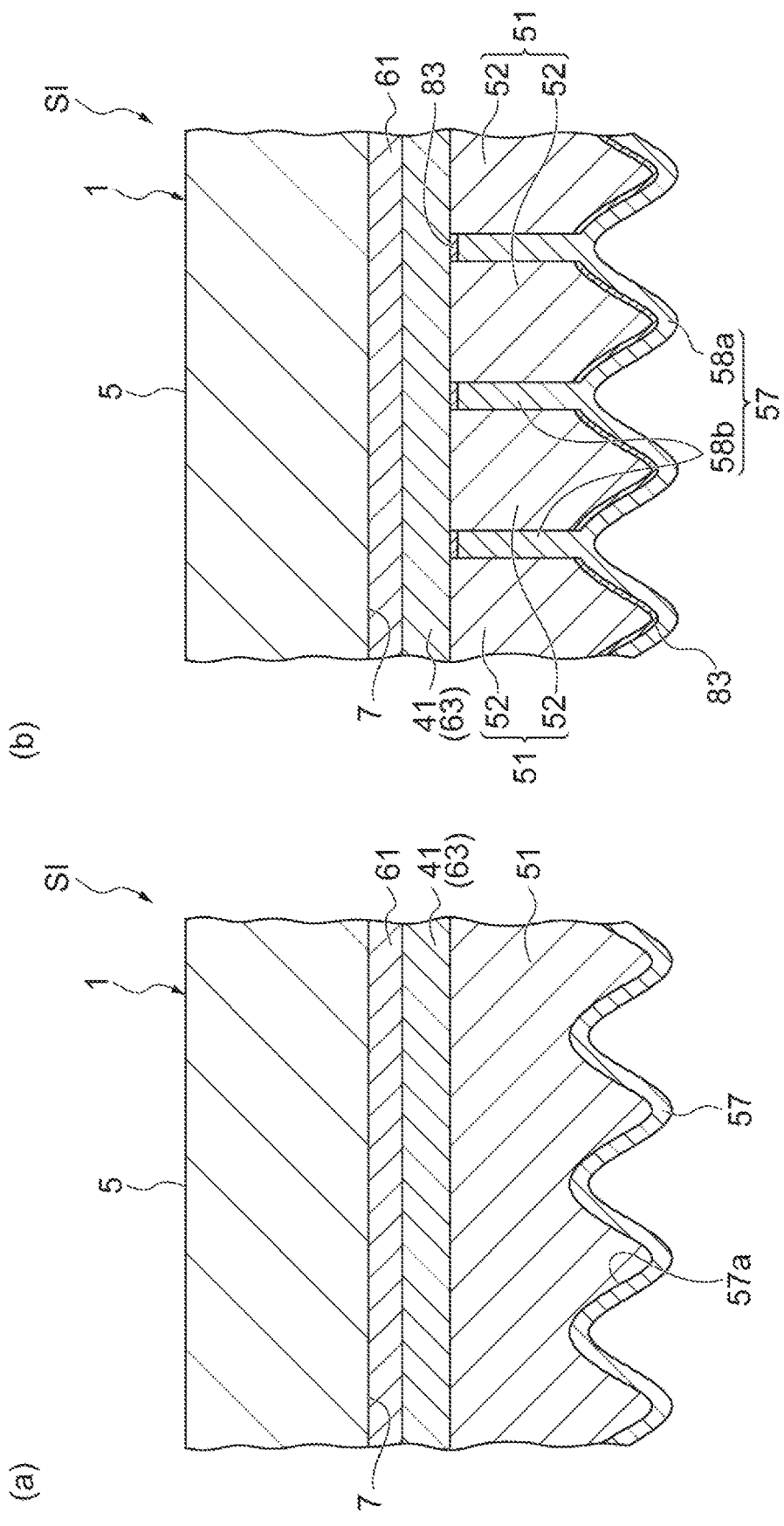
FIG. 12 is a drawing for explaining cross-sectional configurations of back-illuminated solid-state imaging devices according to other modified example of the embodiment.
Figure 13:
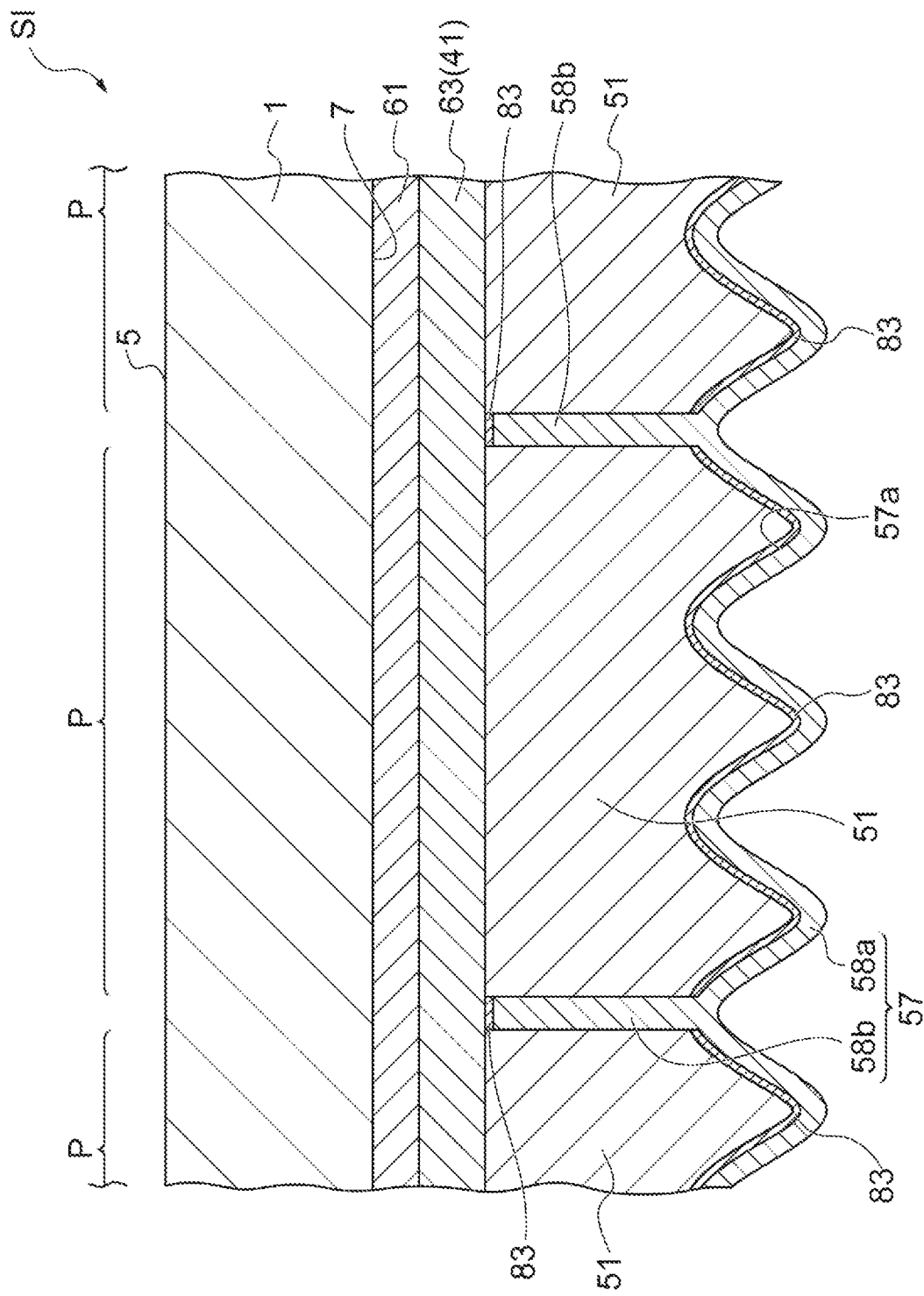
FIG. 13 is a drawing for explaining a cross-sectional configuration of a back-illuminated solid-state imaging device according to yet other modified example of the embodiment.
Figure 14:
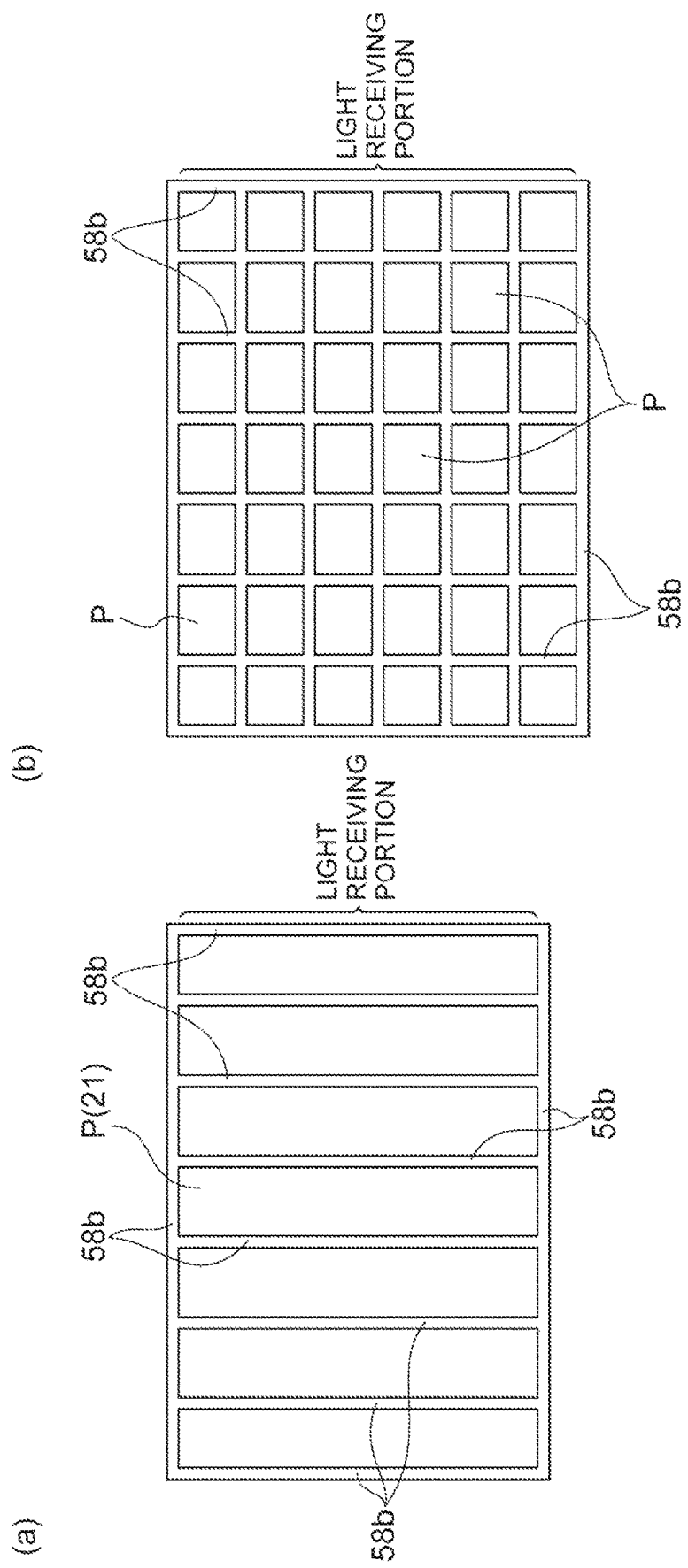
FIG. 14 is a schematic view for explaining a positional relationship between pixels and a light-shielding film.

Next, with reference to FIGS. 12 to 14, the structures of back-illuminated solid-state imaging devices SI according to other modified examples of the present embodiment will now be described. FIG. 12 and FIG. 13 are drawings for explaining cross-sectional configurations of the back-illuminated solid-state imaging devices according to the other modified examples of the present embodiment. FIG. 14 is a schematic view for explaining a positional relationship between the pixels and the light-shielding film.

In the modified examples of FIG. 12, the back-illuminated solid-state imaging devices SI include none of the conductors 53, 55, 81 in the insulating film 51. In other words, the insulating film 51 includes asperities without the conductors 53, 55, 81.

In the modified example of (b) in FIG. 12, the insulating film 51 includes a separated portion per each projection of the asperities. In other words, the insulating film 51 includes a plurality of film portions 52 disposed separately from each other. The light-shielding film 57 is disposed between adjacent film portions 52 as well as on the projections of the asperities of the insulating film 51. In other words, the light-shielding film 57 includes a film portion 58a on the insulating film 51 and a film portion 58b between the film portions 52. The film portion 58b extends in the direction perpendicular to the light-detective surface 7. To prevent the short circuit between the light-shielding film 57 and the electrode 41, the light-shielding film 57 is formed on an insulating film 83 disposed on the electrode 41.

In the modified example of FIG. 13, the insulating film 51 is formed to be separated for each of the pixel P (photosensitive area 21). As shown in (a) of FIG. 14, the film portions 58b are disposed at intervals of the pixel pitch. This configuration suppresses crosstalk of light (light reflected on the uneven surface 57a) between the photosensitive areas 21. As shown in (b) of FIG. 14, when the back-illuminated solid-state imaging device SI is a BT-CCD area image sensor in which a plurality of pixels P are disposed two-dimensionally, the film portions 58b are disposed at intervals of the pixel pitch. Each pixel P is surrounded by the film portions 58b in a plane view.

Figure 15:
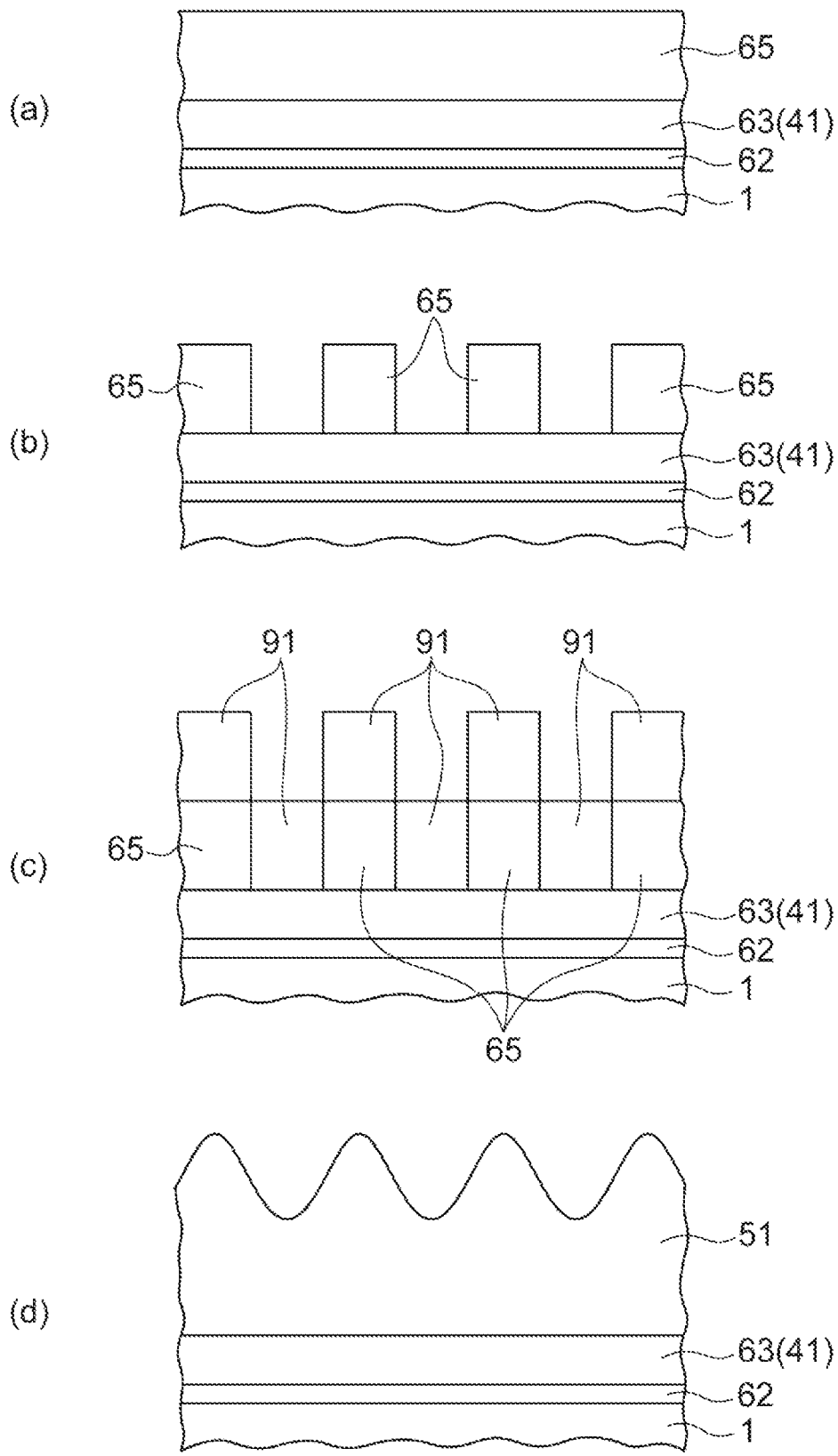
FIG. 15 is a drawing illustrating processes for manufacturing the back-illuminated solid-state imaging device according to the modified example of (a) in FIG. 12.

With reference to FIG. 15, processes for manufacturing the modified example of (a) in FIG. 12 will now be described. FIG. 15 is a drawing illustrating the processes for manufacturing the back-illuminated solid-state imaging device according to the modified example of (a) in FIG. 12.

First, as in the processes shown in (a) to (c) of FIG. 6, the polysilicon film 63 (the electrode 41 and the like) are formed on the side of the light-detective surface 7 of the prepared semiconductor substrate 1, and the insulating film 65 is then formed on the polysilicon film 63 (See (a) in FIG. 15). Next, the insulating film 65 is subjected to patterning (See (b) in FIG. 15). The patterning can be performed by etching. In the process of etching, for example, a mask having openings corresponding to the depressions of the insulating film 51 is used. The exposed portions of the insulating film 65 at the openings are removed by etching, leaving the portions corresponding to the projections of the insulating film 51.

Next, an insulating film 91 is formed on the patterned insulating film 65 (See (c) in FIG. 15). At this time, the insulating film 91 is also formed on the polysilicon film 63 that have been exposed by removal of the insulating film 65. Therefore, the insulating film 65 and the insulating film 91 form asperities. In the areas with the insulating film 65, that is, areas corresponding to the projections of the asperities of the insulating film 51, the insulating films 65, 91 are present. In the areas without the insulating film 65, that is, areas corresponding to the depressions of the asperities of the insulating film 51, the insulating film 65 is not present but only the insulating film 91 is present. The insulating film 91 is also made of a BPSG for example, and constitutes a part of the insulating film 51.

Next, the asperities formed by the insulating films 65, 91 are subjected to reflow (heat treatment), so that the asperities change their forms (See (d) in FIG. 15). The insulating films 65, 91 are melted, whereby the insulating film 51 with the smoothed asperities is formed. Then, the light-shielding film 57 is formed on the insulating film 51. Accordingly, the modified example of (a) of FIG. 12 is embodied.

Figure 16:
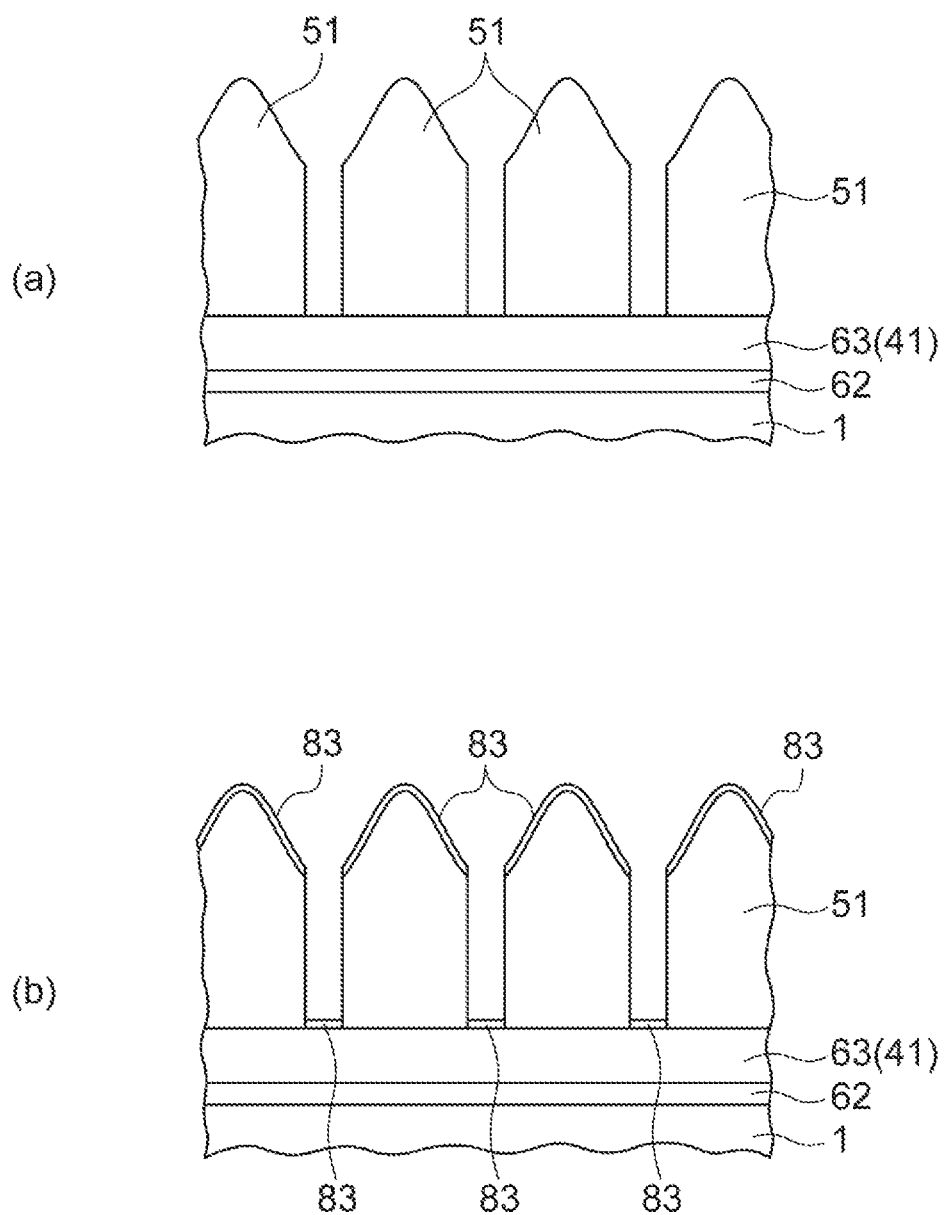
FIG. 16 is a drawing illustrating processes for manufacturing the back-illuminated solid-state imaging device according to the modified example of (b) in FIG. 12.

Next, with reference to FIG. 16, processes for manufacturing the modified example of (b) in FIG. 12 will now be described. FIG. 16 is a drawing illustrating the processes for manufacturing the back-illuminated solid-state imaging device according to the modified example of (b) in FIG. 12

The insulating film 51 with the smoothed asperities is formed as in the processes shown in (a) to (d) of FIG. 15. The descriptions of the same processes will be eliminated. After the process of reflow, the portions corresponding to the depressions of the asperities of the insulating film 51 are removed (See (a) in FIG. 16). Consequently, the polysilicon film 63 (the electrode 41, for example) is partially exposed. The partial removal of the insulating film 51 can be performed by etching.

Next, the insulating film 83 is formed on the exposed portions of the polysilicon film 63 (See (b) in FIG. 16). At this time, the insulating film 83 is also formed on the remaining portions of the insulating film 51. The insulating film 83 on the insulating film 51, however, is not necessarily formed. The insulating film 83 is a silicon oxide film, for example. Then, the light-shielding film 57 is formed on the insulating film 83. Accordingly, the modified example of (b) in FIG. 12 is embodied.

The above described the embodiments of the present invention but it should be noted that the present invention does not always have to be limited to the foregoing embodiments and can be modified in many ways without departing from the scope and spirit of the invention.

For example, the light-shielding film 57 may be composed of a light-absorptive material (a carbon black or the like). In which case, the light-shielding film 57 functions as a light-absorptive film. Even if the light-shielding film 57 functions as the light-absorptive film, light may reflect in the interface between the light-shielding film 57 and the insulating film 51. Even with the light-shielding film 57 functioning as a light-absorptive film, the uneven surface 57a is necessary to suppress an etaloning phenomenon.

The first and second conductors 53, 55, and the conductors 81 extend in the first direction D1 in the above embodiments, however, they do not always have to be limited to this configuration. The first and second conductors 53, 55, and the conductors 81 may extend in the second direction D2. When the photosensitive area 21 has a rectangular shape having the long edges in the second direction D2 in a plane view, however, the first and second conductors 53, 55, and the conductors 81 should preferably extend in the first direction D1 as described above.

The first and second conductors 53, 55 and the conductors 81 extend along the first directions D1 between the ends of the light receiving portion 13 in the first directions D1 in the above embodiments, however, they do not always have to be limited to this configuration. The first and second conductors 53, 55 and the conductors 81 may include a plurality of conductive bodies disposed separately from each other in the first direction D1.

INDUSTRIAL APPLICABILITY

The present invention can be applied to a back-illuminated solid-state imaging device such as a BT-CCD linear image sensor.

REFERENCE SIGNS LIST

1: semiconductor substrate, 5: bottom surface, 7: light-detective surface, 13: light receiving portion, 15: storage unit, 17: transfer unit, 19: shift register, 21: photosensitive area, 23: electric potential gradient forming unit, 51: insulating film, 53: first conductor, 55: second conductor, 57: light-shielding film, 57a: uneven surface, 81: conductor, D1: first direction, D2: second direction, SI: back-illuminated solid-state imaging device.

The invention claimed is:

1. A back-illuminated solid-state imaging device, comprising:
   a semiconductor substrate including a light incident surface on a back side and a light receiving portion generating a charge in accordance with light incidence;
   a charge transfer unit disposed on a side of a light-detective surface opposite to the light incident surface of the semiconductor substrate; and
   a light-shielding film disposed on the side of the light-detective surface of the semiconductor substrate,
   wherein the light-shielding film includes an uneven surface opposing the light-detective surface,
   the back-illuminated solid-state imaging device further comprising:
   an insulating film between the semiconductor substrate and the light-shielding film, the light-shielding film being disposed on the insulating film,
   wherein the insulating film includes asperities, and
   the uneven surface of the light-shielding film is formed to conform to the asperities of the insulating film,
   a plurality of conductors disposed in the insulating film and along the light-detective surface,
   wherein the asperities of the insulating film are formed in a manner corresponding to the plurality of conductors, and
   wherein the uneven surface reflects light incident on the light incident surface and transmitted through the semiconductor substrate,
   the light receiving portion includes a plurality of pixels,
   the light-shielding film includes a plurality of regions disposed on the light receiving portion, each of the plurality of regions being disposed on a corresponding pixel of the plurality of pixels,
   the plurality of conductors are disposed on the light receiving portion, and
   the plurality of regions of the light-shielding film disposed on the light receiving portion includes the uneven surface of the light-shielding film, and
   at each of the regions of the light-shielding film, the uneven surface includes a plurality of projected surfaces a plurality of depressed surfaces positioned to be alternately repeated and continuous.

2. The back-illuminated solid-state imaging device according to claim 1,
   wherein the light-shielding film is made of a conductive r petal material, and
   among the plurality of conductors, the light-shielding film is electrically connected to a conductor other than a conductor to which a predetermined signal is fed.

3. The back-illuminated solid-state imaging device according to claim 1,
   wherein the plurality of conductors includes a plurality of first conductors and a plurality of second conductors, the first conductors and the second conductors being disposed alternately with their ends overlapping each other, and
   the asperities of the insulating film are formed in a manner corresponding to differences in level formed by the first conductors and second conductors.

4. The back-illuminated solid-state imaging device according to claim 1,
   wherein the insulating film includes a separated portion at least per the plurality of pixels, and
   the light-shielding film is disposed between the separated portions of the insulating film.

5. The back-illuminated solid-state imaging device according to claim 1,
   wherein the light receiving portion includes a plurality of photosensitive areas disposed in a first direction as the plurality of pixels,
   a plurality of electric potential gradient forming units are disposed on the side of the light-detective surface of the semiconductor substrate, the plurality of electric potential gradient forming units forming an electric potential gradient increasing along a second direction perpendicular to the first direction for the corresponding photosensitive area,
   the charge transfer unit transfers the charge from the plurality of photosensitive areas in the first direction, and
   the light-shielding film is disposed to cover the plurality of electric potential gradient forming units and the charge transfer unit.

6. The back-illuminated solid-state imaging device according to claim 5,
   wherein each of the photosensitive areas has a rectangular shape having long edges in the second direction in a plan view, and
   the projected surfaces and the depressed surfaces of the uneven surface of the light-shielding film are repetitively continued in the second direction.

7. The back-illuminated solid-state imaging device according to claim 1, wherein
   the light receiving portion includes a plurality of photosensitive areas disposed in a first direction as the plurality of pixels,
   a plurality of electric potential gradient forming units are disposed on the side of the light-detective surface of the semiconductor substrate, the plurality of electric potential gradient forming units forming an electric potential gradient increasing along a second direction perpendicular to the first direction for the corresponding photosensitive area,
   the charge transfer unit transfers the charge from the plurality of photosensitive areas in the first direction,
   the light-shielding film is disposed to cover the plurality of electric potential gradient forming units, and
   the plurality of conductors is located on the plurality of electric potential gradient forming units.

8. The hack-illuminated solid-state imaging device according to claim 7, wherein
   the light-shielding film is made of a conductive metal material, and
   the plurality of conductors is electrically connected to the light-shielding film.

9. The back-illuminated solid-state imaging device according to claim 1, wherein
   the light-detective surface includes no uneven surface.

* * * * *